United States Patent
Song

(10) Patent No.: US 11,038,007 B2
(45) Date of Patent: Jun. 15, 2021

(54) DISPLAY PANELS

(71) Applicant: KunShan Go-Visionox Opto-Electronics Co., Ltd., Kunshan (CN)

(72) Inventor: Yanqin Song, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/429,285

(22) Filed: Jun. 3, 2019

(65) Prior Publication Data

US 2019/0288054 A1  Sep. 19, 2019

Related U.S. Application Data

(63) Continuation of application No. PCT/CN2018/092005, filed on Jun. 20, 2018.

(30) Foreign Application Priority Data

Oct. 31, 2017  (CN) .......................... 201721426897.X

(51) Int. Cl.
*H01L 27/32* (2006.01)
*H01L 51/52* (2006.01)

(52) U.S. Cl.
CPC ...... *H01L 27/3276* (2013.01); *H01L 51/5206* (2013.01); *H01L 51/5221* (2013.01)

(58) Field of Classification Search
None
See application file for complete search history.

(56) References Cited

U.S. PATENT DOCUMENTS

| | | | |
|---|---|---|---|
| 7,019,718 B2 * | 3/2006 | Yamazaki | G02F 1/1339 345/76 |
| 2011/0102402 A1 | 5/2011 | Han | |
| 2011/0157110 A1 | 6/2011 | Chou et al. | |
| 2013/0027282 A1 * | 1/2013 | Kimura | H05K 3/361 345/80 |
| 2017/0365217 A1 * | 12/2017 | An | G09G 3/3233 |

FOREIGN PATENT DOCUMENTS

| | | |
|---|---|---|
| CN | 107123666 A | 9/2017 |
| CN | 107275364 A | 10/2017 |
| CN | 107527933 A | 12/2017 |
| CN | 107863373 A | 3/2018 |
| CN | 207303104 U | 5/2018 |
| JP | 2011221204 A | 11/2011 |

OTHER PUBLICATIONS

International Search Report dated Sep. 20, 2018 in corresponding International application No. PCT/CN2018/092005; 5 pages.

* cited by examiner

*Primary Examiner* — Andre L Matthews
(74) *Attorney, Agent, or Firm* — Maier & Maier, PLLC

(57) ABSTRACT

The disclosure provides a display panel including: the display substrate including a display area and a non-display area. The non-display area is provided therein with a first circuit and a second circuit extending to the display area respectively. The non-display area is further provided therein with a first auxiliary circuit electrically connected in parallel with the first circuit and/or a second auxiliary circuit electrically connected in parallel with the second circuit.

8 Claims, 3 Drawing Sheets

DISPLAY PANELS

CROSS REFERENCE

This application is a continuation of International Application No. PCT/CN2018/092005, filed on Jun. 20, 2018, which claims priority to Chinese Patent Application No. 201721426897.X, entitled "Display Panels" filed on Oct. 31, 2017, the contents of which are expressly incorporated by reference herein in their entireties.

FIELD OF THE DISCLOSURE

The disclosure relates to display technologies, and more particularly to display panels.

BACKGROUND

With the rapid development of electronic industry, the penetration rate of electronic products is getting higher and higher, such as a computer, a tablet or a mobile phone. The above electronic products have become necessities in people's daily lives. AMOLED (i.e., Active-Matrix Organic Light-Emitting Diode) has been widely used for its advantages such as high chroma, high contrast, wide viewing angle, self luminous and flexible display. In the current AMOLED circuit layout, a display area of a screen is continuously increased and the space of the non-display area is continuously squeezed and reduced so that the remaining spaces in the non-display area in which lines are allowed to pass through are narrow. Under such circumstance, a space in which lines can be arranged is usually not large, resulting in excessive resistance of the lines, high display luminance of the display panel at one side close to the signal end and poor display luminance of the display panel at the other side away from the signal end, thereby making the luminance of the overall display panel inconsistent.

SUMMARY

To solve the above problem, the disclosure provides a display panel including: a display substrate with a display area and a non-display area, the non-display area being provided therein with a first circuit and a second circuit extending to the display area, respectively; the non-display area being further provided with at least one first auxiliary circuit electrically connected in parallel with the first circuit and/or at least one second auxiliary circuit electrically connected in parallel with the second circuit.

According to an embodiment of the disclosure, the above first circuit comprises a first line and a second line, and the first auxiliary circuit is connected to the first line and the second line.

According to an embodiment of the disclosure, the above second circuit comprises a third line and a fourth line, at least one second auxiliary circuit comprises two second auxiliary circuits, one of the two second auxiliary circuits is electrically connected in parallel with the third line, and the other one of the two second auxiliary circuits is electrically connected in parallel with the fourth line.

According to an embodiment of the disclosure, a line length of the second auxiliary circuit which is electrically connected in parallel with the third line is equal to a line length of the second auxiliary circuit which is electrically connected in parallel with the fourth line.

According to an embodiment of the disclosure, a cross-sectional area of the line of the second auxiliary circuit which is electrically connected in parallel with the third line is equal to a cross-sectional area of the line of the second auxiliary circuit which is electrically connected in parallel with the fourth line.

According to an embodiment of the disclosure, the above first circuit is an anode (VDD) trace.

According to an embodiment of the disclosure, the at least one first auxiliary circuit is an anode (VDD) auxiliary trace.

According to an embodiment of the disclosure, the above second circuit is a cathode (VSS) trace.

According to an embodiment of the disclosure, the at least one second auxiliary circuit is an anode (VDD) auxiliary trace.

According to an embodiment of the disclosure, the above display substrate comprises a bonding area, and the first circuit and the second circuit are connected to the bonding area.

Disadvantages of the prior art are improved by using such a display panel. In the disclosure, an auxiliary circuit is added to the first circuit and/or the second circuit in the non-display area, thus effectively increasing the amount of current flowing therethrough. In other words, the resistance of the anode (VDD) and cathode (VSS) traces may be decreased and the resistance voltage drops (IR drops) is decreased accordingly, thereby improving the problem of uneven display luminance of the display panel.

BRIEF DESCRIPTION OF THE DRAWINGS

The drawings described herein are provided for further understanding of the disclosure and as a part of the disclosure. The exemplary embodiments of the disclosure and description thereof are used to explain the disclosure and not as any improper limitation to the disclosure. In the drawings.

DETAILED DESCRIPTION OF PREFERRED EMBODIMENTS

Figure 1:
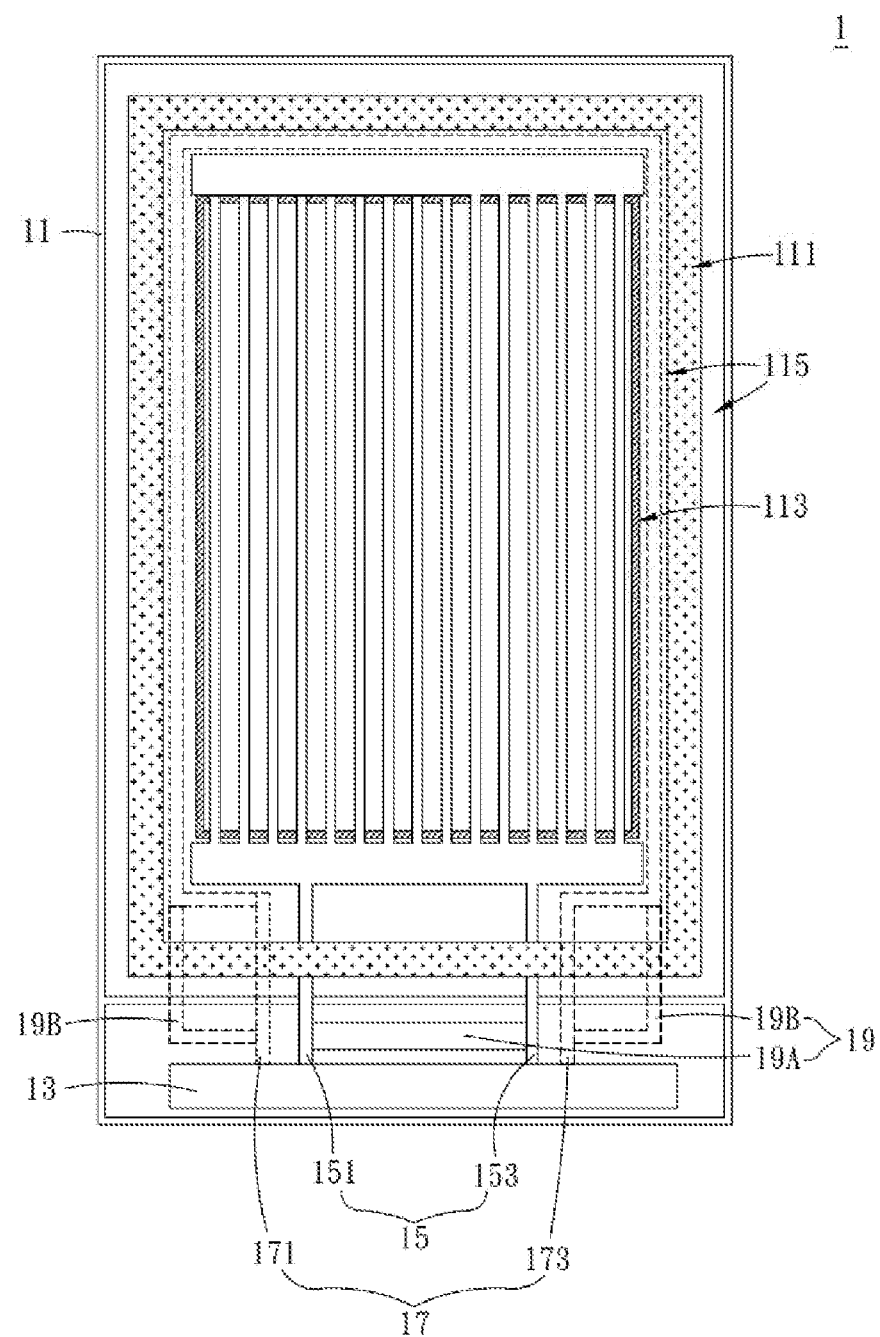
FIG. 1 is a schematic view of an exemplary embodiment of a display panel of the disclosure.

In the following, various embodiments of the disclosure will be disclosed in the drawings, and for the sake of clarity, practical details will be described in the following description. However, it should be understood that these practical details are not intended to limit the disclosure. That is, in some embodiments of the disclosure, these practical details are not necessary. In addition, for the simplicity of the drawings, some of the conventional structures and components are drawn in the drawings in a simplified schematic representation.

In view of the above, the technical problem to be solved by the disclosure cannot be solved by the prior art. It is known that since an AMOLED screen has a large display area, a corresponding space of a non-display area is reduced, and a small space can be available for arranging lines, and the lines are also relatively small, and an amount of current flowing through the lines is not much, which causes the display panel has a good power supply intensity in one side close to the power supply, so that the luminance of the display panel is high. However, the power supply intensity of the display panel in the other side away from the power supply is poor, resulting in an uneven display in the display panel.

Please refer to FIG. 1, which is a schematic view of an exemplary embodiment of a display panel of the disclosure. As shown in the figure, the present exemplary embodiment provides a display panel 1 which makes the display luminance of the display panel uniform by adding electrically parallel lines in a non-display area of a display substrate. The display panel 1 includes a display substrate 11, a first circuit 15, a second circuit 17, and at least one auxiliary circuit 19. At least one auxiliary circuit 19 includes a first auxiliary circuit 19A and a second auxiliary circuit 19B.

As described above, the display substrate 11 has a display area 113 and a non-display area 115 and the first circuit 15 and the second circuit 17 separately extending to the display area 113 are arranged in the non-display area 115. The first auxiliary circuit 19A electrically connected in parallel with the first circuit 15 and/or the second auxiliary circuit 19B electrically connected in parallel with the second circuit 17 are/is also arranged in the non-display area 115. In other words, the present exemplary embodiment includes the first auxiliary circuit 19A electrically connected in parallel with the first circuit 15, or the second auxiliary circuit 19B electrically connected in parallel with the second circuit 17, or both circuits which are used simultaneously.

In the present exemplary embodiment, the display substrate 11 has a package area 111. The display area 113 is located at an inner side of the package area 111, and the non-display area 115 is located at an exterior side of the package area 111 and arranged in a ring around the display area 113. A bonding area 13 is located on the display substrate 11 and at one side of the package area 111. At least one auxiliary circuit 19 is added to the first circuit 15 and at least one auxiliary circuit 19 is added to the second circuit 17, thereby improving the resistance voltage drops (IR drops) of the first circuit 15 and the second circuit 17. When current flows through the first circuit 15 and the second circuit 17, the difference between the resistance voltage drops may not be too large, thereby ensuring stability of the voltage value in the display panel and reducing power consumption of the screen.

In the present exemplary embodiment, the first circuit 15 is an anode (VDD) trace that provides an anode voltage for an organic light-emitting diode (OLED). The first circuit 15 has a first line 151 and a second line 153. One end of the first line 151 and one end of the second line 153 are connected to the bonding area 13. The other end of the first line 151 and the other end of the second line 153 extend through a portion of the non-display area 115 in the package area 111, and are distributed in the display area 113 in the package area 111. And the first line 151 and the second line 153 of the first circuit 15 which are distributed in the display area 113 are parallel lines. In the present exemplary embodiment, lines inside the package area 111 are simply connected to lines in the present exemplary embodiment, and the layout manner of the lines in the package area 111 does not affect the implementation of the present exemplary embodiment. Therefore, the lines layout inside the package area 111 will not be described in detail any more. The at least one auxiliary circuit 19 is the first auxiliary circuit 19A, and the first auxiliary circuit 19A is connected between the first line 151 and the second line 153 outside the package area 111. In this way, the current flow of the first circuit 15 can be directly increased, thereby reducing the resistance of the first circuit 15 and improving the luminance uniformity of the entire screen when the screen is in a display state. And, the added first auxiliary circuit 19A is arranged outside the package area 111, thereby reducing the change in and influence on the trace lines in the package area 111.

In the present exemplary embodiment, the second circuit 17 is a cathode (VSS) trace that provides a cathode voltage for the organic light-emitting diode (OLED). The second circuit 17 has a third line 171 and a fourth line 173 which are located at both sides of the first circuit 15 respectively. One end of the third line 171 and one end of the fourth line 173 are respectively connected to the bonding area 13, and the other end of the third line 171 and the other end of the fourth line 173 respectively extend into and are distributed in the non-display area 115 and the display area 113. In other words, a main line of the second circuit 17 which is distributed in the non-display area 115 is an inverted-U shape. The at least one auxiliary circuit 19 includes two second auxiliary circuits 19B. One end of one of the second auxiliary circuits 19B is connected to the third line 171 outside the package area 111, and the other end of the second auxiliary circuits 19B is connected to the third line 171 inside the package area 111. One end of the other second auxiliary circuit 19B is connected to the fourth line 173 outside the package area 111, and the other end of the other second auxiliary circuit 19B is connected to the fourth line 173 inside the package area 111. The lengths of the two auxiliary circuits 19B are the same, and the cross-sectional areas of the two auxiliary circuits 19B are the same. In this way, the current flow rate of the second circuit 17 may be directly increased, thereby reducing the resistance of the second circuit 17 and improving the luminance uniformity of the entire screen when the screen is in a display state. Also, the added second auxiliary circuits 19B are arranged adjacent to the package boundary outside the package area 111 and inside the package area 111, thereby also reducing the change in and influence on the trace lines in the package area 111.

Figure 2:
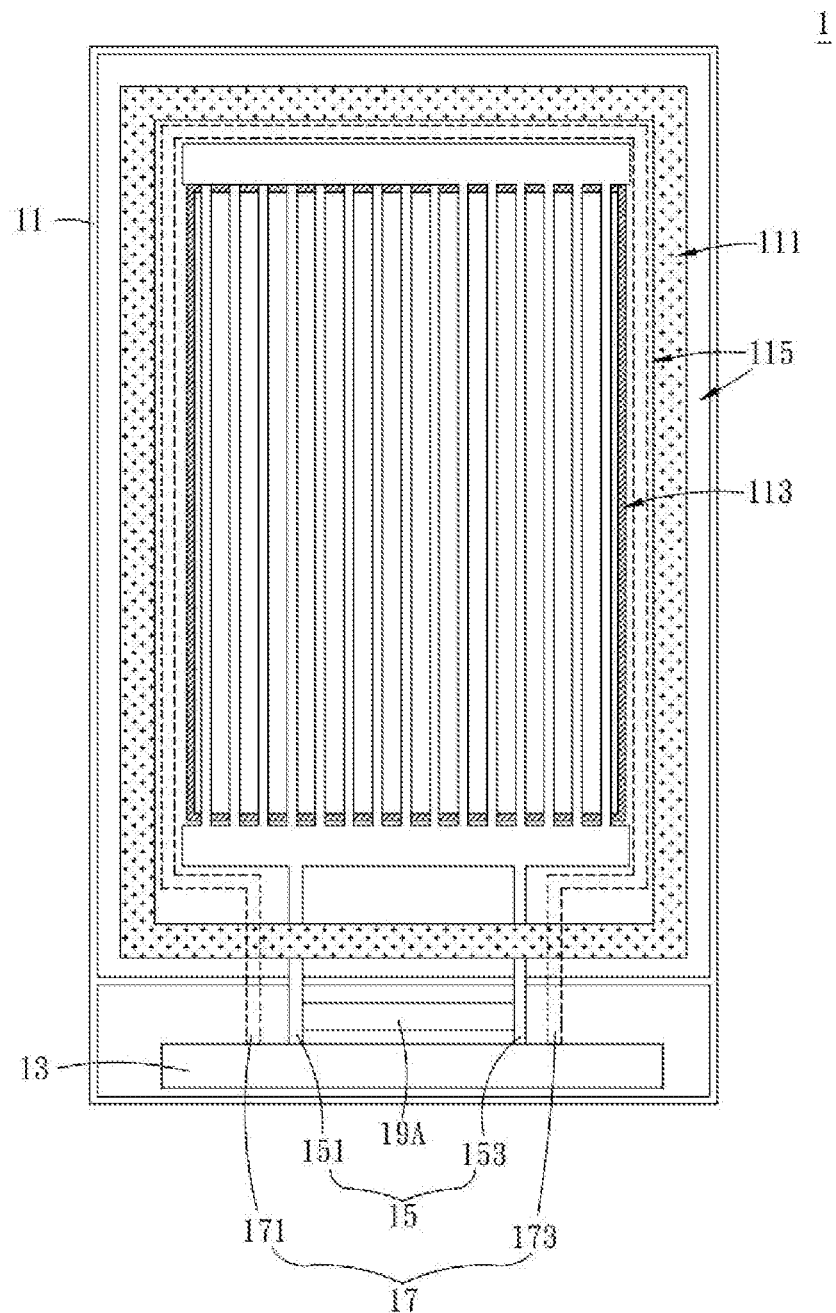
FIG. 2 is another schematic view of an exemplary embodiment of a display panel of the disclosure.

Please also refer to FIG. 2, which is another schematic view of the display panel of the disclosure. As shown in the FIG. 2, the difference between the present exemplary embodiment and the first embodiment described above is that the second auxiliary circuit 19B of at least one auxiliary circuit 19 is omitted. The present exemplary embodiment adopts the first auxiliary circuit 19A to connect the first line 151 with the second line 153 which are outside the package area 111. The structural connection relationship and efficiency of the first auxiliary circuit 19 are the same as the first embodiment and thus will not be described here in detail any more.

Figure 3:
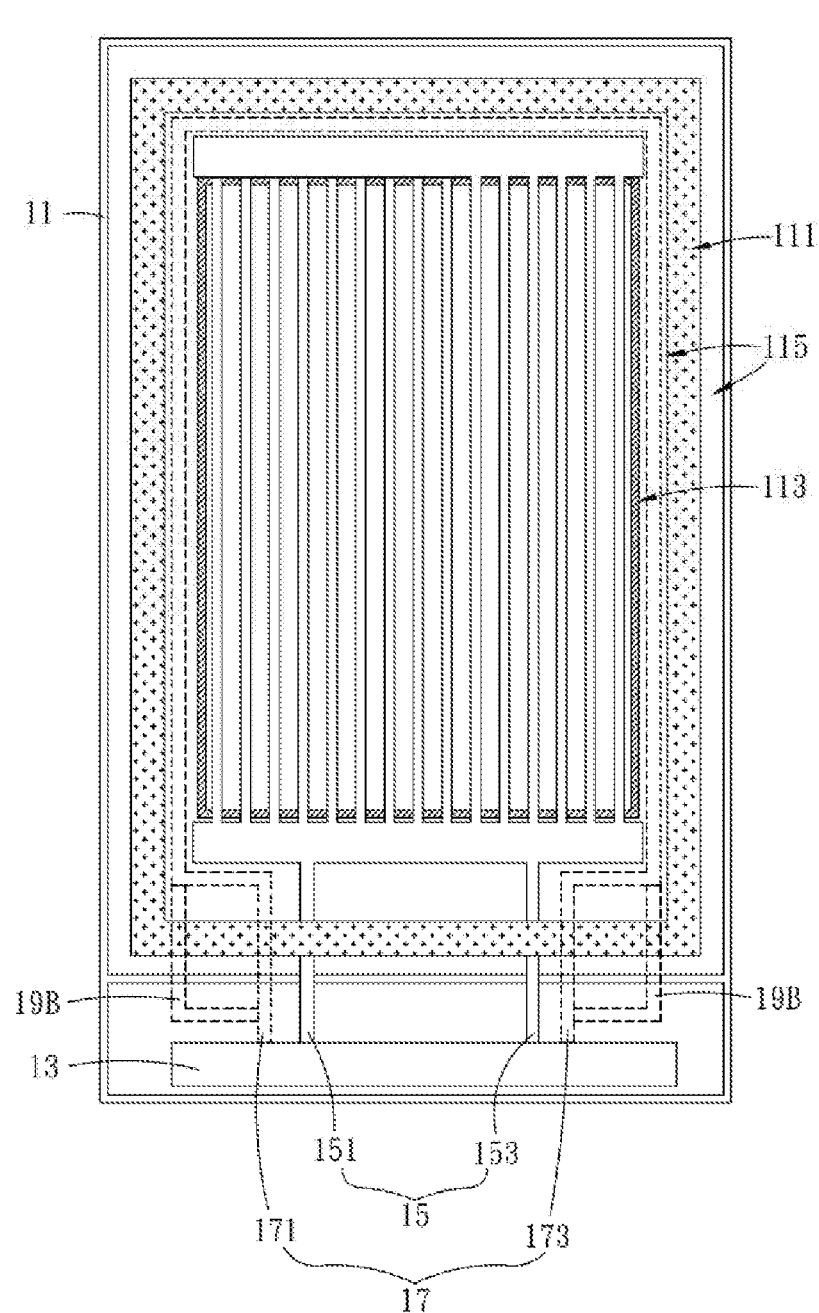
FIG. 3 is still another schematic view of an exemplary embodiment of a display panel of the disclosure.

Please also refer to FIG. 3, which is still another schematic view of the display panel of the disclosure. As shown in FIG. 3, the difference between the present exemplary embodiment and the first embodiment described above is that the first auxiliary circuit 19A of at least one auxiliary circuit 19 is omitted. The present exemplary embodiment adopts two second auxiliary circuits 19B connected to the third line 171 and the fourth line 173 outside the package area 111, respectively. The structural connection relationship and efficiency of the second auxiliary circuit 19B are the same as the first embodiment and thus will not be described here in detail any more.

In summary, the disclosure provides a display panel including a display substrate, a bonding area, a first circuit, and a second circuit. Anode (VDD) traces and cathode (VSS) traces outside the package area are further added to the display panel, that is, additionally, parallel auxiliary circuits are added on the basis of the original anode (VDD) traces and the cathode (VSS) traces. Such manner of adding lines may effectively increase the amount of the current flowing therethrough. In other words, the resistance of the anode (VDD) traces and cathode (VSS) traces can be decreased and the internal resistance voltage drop (IR drop) is decreased accordingly, thereby improving the luminance uniformity of the display panel. Also, the added auxiliary circuits are arranged outside the package area, thereby alleviating interference in trace lines within the package area.

The above description shows and describes several preferred embodiments of the disclosure. However, as described before, it should be understood that the disclosure is not limited to the forms disclosed herein, and should not be construed as an exclusion to other embodiments, and other combinations, modifications, and environments are possible which can be modified based on the above teachings or the related technologies or knowledge within the scope of the concept described herein. All changes and modifications made by those skilled in the art are intended to be within the scope of the appended claims of the disclosure without departing from the spirit and the scope of the disclosure.

What is claimed is:

1. A display panel comprising:
    a display substrate comprising a display area and a non-display area, the non-display area being provided with a first circuit and a second circuit extending to the display area, respectively; the non-display area being further provided with at least one first auxiliary circuit electrically connected in parallel with the first circuit and at least one second auxiliary circuit electrically connected in parallel with the second circuit,
    wherein the second circuit comprises a third line and a fourth line, at least one second auxiliary circuit comprises two second auxiliary circuits, one of the two second auxiliary circuits is electrically connected in parallel with the third line, and the other one of the two second auxiliary circuits is electrically connected in parallel with the fourth line,
    wherein the display substrate further comprises package area, the display area is located at an inner side of the package area, and the non-display area is located at an exterior side of the package area and arranged in a ring around the display area,
    wherein the first circuit comprises a first line and a second line, the first line and the second line extend from the non-display area to the display area, and the at least one first auxiliary circuit is connected between the first line and the second line outside the package area,
    wherein the third line and the fourth line are located at both sides of the first circuit respectively, wherein one end of the one of the two second auxiliary circuits is connected to the third line outside the package area, and the other end of the one of the two second auxiliary circuits is connected to the third line inside the package area, wherein one end of the other one of the two second auxiliary circuits is connected to the fourth line outside the package area, and the other end of the other one of the two second auxiliary circuits is connected to the fourth line inside the package area.

2. The display panel of claim 1, wherein a line length of the second auxiliary circuit electrically connected in parallel with the third line is equal to a line length of the second auxiliary circuit electrically connected in parallel with the fourth line.

3. The display panel of claim 1, wherein a cross-sectional area of the line of the second auxiliary circuit which is electrically connected in parallel with the third line is equal to a cross-sectional area of the line of the second auxiliary circuit which is electrically connected in parallel with the fourth line.

4. The display panel of claim 1, wherein the first circuit is an anode (VDD) trace.

5. The display panel of claim 4, wherein the at least one first auxiliary circuit is an anode (VDD) auxiliary trace.

6. The display panel of claim 1, wherein the second circuit is a cathode (VSS) trace.

7. The display panel of claim 6, wherein the at least one second auxiliary circuit is an anode (VDD) auxiliary trace.

8. The display panel of claim 1, wherein the display substrate comprises a bonding area, and the first circuit and the second circuit are connected to the bonding area.

* * * * *